US012805417B2

(12) United States Patent
Thompson et al.

(10) Patent No.: US 12,805,417 B2
(45) Date of Patent: Nov. 17, 2026

(54) MULTI-DIE ISOLATED LEAD FRAME PACKAGE

(71) Applicant: Allegro MicroSystems, LLC, Manchester, NH (US)

(72) Inventors: Andrew Thompson, Northwich (GB); Federico Frego, Milan (IT)

(73) Assignee: Allegro MicroSystems, LLC, Manchester, NH (US)

( * ) Notice: Subject to any disclaimer, the term of this patent is extended or adjusted under 35 U.S.C. 154(b) by 406 days.

(21) Appl. No.: 18/430,841

(22) Filed: Feb. 2, 2024

(65) Prior Publication Data

US 2025/0253213 A1 Aug. 7, 2025

(51) Int. Cl.

| | |
|---|---|
| ***H10W 90/00*** | (2026.01) |
| ***H10W 20/20*** | (2026.01) |
| ***H10W 70/40*** | (2026.01) |
| ***H10W 70/60*** | (2026.01) |
| ***H10W 72/00*** | (2026.01) |
| ***H10W 72/50*** | (2026.01) |
| ***H10W 72/90*** | (2026.01) |

(52) U.S. Cl.

CPC ........ *H10W 90/811* (2026.01); *H10W 70/475* (2026.01); *H10W 70/60* (2026.01); *H10W 70/611* (2026.01); *H10W 90/00* (2026.01); *H10W 20/20* (2026.01); *H10W 72/07552* (2026.01); *H10W 72/07554* (2026.01); *H10W 72/527* (2026.01); *H10W 72/5445* (2026.01); *H10W 72/547* (2026.01); *H10W 72/932* (2026.01); *H10W 72/936* (2026.01); *H10W 72/9445* (2026.01); *H10W 90/751* (2026.01); *H10W 90/752* (2026.01); *H10W 90/753* (2026.01); *H10W 90/754* (2026.01); *H10W 90/756* (2026.01); *H10W 90/758* (2026.01)

(58) Field of Classification Search

CPC . H10W 90/811; H10W 70/475; H10W 70/60; H10W 70/611; H10W 90/00; H10W 20/20; H10W 72/07552; H10W 72/07554; H10W 72/527; H10W 72/5445; H10W 72/547; H10W 72/932; H10W 72/936; H10W 72/9445; H10W 90/751; H10W 90/752; H10W 90/753; H10W 90/754; H10W 90/756; H10W 90/758

See application file for complete search history.

(56) References Cited

U.S. PATENT DOCUMENTS 8,736,343 B2 5/2014 Chen et al.
2003/0199118 A1* 10/2003 Park .................... H10W 74/117 438/106

(Continued)

*Primary Examiner* — J. E. Schoenholtz
(74) *Attorney, Agent, or Firm* — Daly, Crowley, Mofford & Durkee, LLP

(57) ABSTRACT

An integrated circuit (IC) package and assembly includes a stacked arrangement of one or more IC die to leverage additional functionality in a standard package width. Active IC die and high voltage IC capacitors may be stacked in various arrangements to minimize the footprint and width of the IC package. The die are interconnected with each other and a lead frame with wire bonds, silicon vias or other interconnections. Various bond pad configurations are used to interconnect the die. The stacked arrangement of the IC die reduces the width of the supporting lead frame and reduces the overall footprint of the IC package.

31 Claims, 5 Drawing Sheets

(56) References Cited

U.S. PATENT DOCUMENTS

| | | | | |
|---|---|---|---|---|
| 2009/0091032 | A1* | 4/2009 | Hsu | H10P 74/273<br>257/E23.021 |
| 2013/0127061 | A1* | 5/2013 | Pendse | H10W 72/20<br>257/773 |
| 2020/0027848 | A1* | 1/2020 | Bonifield | H10W 44/601 |
| 2022/0352111 | A1* | 11/2022 | Li | H10W 70/465 |
| 2023/0085441 | A1* | 3/2023 | Rudiak | H10W 20/497<br>257/725 |
| 2024/0030148 | A1* | 1/2024 | Koo | H10W 70/65 |

* cited by examiner

MULTI-DIE ISOLATED LEAD FRAME PACKAGE

FIELD OF TECHNOLOGY

The described technology generally relates to integrated circuit packages, more particularly to multi-chip isolated lead frame packages with minimized dimensions.

BACKGROUND

Integrated circuit (IC) packages often include one or more semiconductor die, a lead frame, and a molding material encapsulating the die and at least a portion of the lead frame. The size and footprint of an IC package may depend on the number of die as well as how those die are connected with each other and the lead frame. The amount of available space on a printed circuit board (PCB) or other substrate is limited and it is desirable to minimize the footprint of the IC package.

IC packages with multiple die have increased dimensions to accommodate the die, additional interconnects and other components. Traditional layouts include horizontally spacing and serially connecting the multiple die across the width of the lead frame, which increases the width of the overall package. For example, in packages where electrical isolation may be necessary to allow communication between one or more die, isolation capacitors may be used to ensure signal integrity and protect the circuitry from high voltages. In such packages however, placing and connecting the die (for example, two active ICs and two isolation capacitors) horizontally across the lead frame requires an increased width to the lead frame dimensions, resulting in a non-standard package size.

SUMMARY

Aspects of the present disclosure relate to an integrated circuit (IC) package and assembly including a stacked arrangement of one or more IC die using a standard lead frame width. According to one aspect, active IC die and high voltage IC capacitors may be stacked in various arrangements to minimize the footprint and width of the IC package. The die may be connected with each other and a lead frame with wire bonds, silicon vias or other interconnections. Various bond pad configurations may be used to interconnect the die. The stacked arrangement of the IC die may reduce the needed width of the supporting lead frame and reduce the overall footprint of the IC package.

According to one aspect, an IC package may include a substrate defining a first substrate portion and a second substrate portion. Each of the first substrate portion and the second substrate portion may include a first surface and signal leads. A first semiconductor die may be electrically coupled to the substrate and disposed adjacent to the first surface of the first substrate portion. A second semiconductor die may be electrically coupled to the first semiconductor die and disposed vertically to the first semiconductor die. A third semiconductor die may be electrically coupled to the substrate and disposed adjacent to the first surface of the second substrate portion. A fourth semiconductor die may be electrically coupled to the third semiconductor die and disposed vertically of the third semiconductor die. The second semiconductor die may be electrically coupled to the fourth semiconductor die.

The IC package may include one or more of the following features alone or in combination. The substrate may be a lead frame. The substrate may be a printed circuit board (PCB). The second and fourth semiconductor die may comprise isolation circuits and/or isolation capacitors. The first and third semiconductor die may be isolation circuits and/or capacitor. The first and second substrate portions may define an isolation gap therebetween. The first semiconductor die may be electrically coupled to the second semiconductor die by a first wire bond, and the third semiconductor die may be electrically coupled to the fourth semiconductor die by a second wire bond. The first semiconductor die may be electrically coupled to the second semiconductor die by a first silicon via, and the third semiconductor die may be electrically coupled to the fourth semiconductor die by a second silicon via. Each of the first and second semiconductor die may be coupled to the first and second substrate portions, respectively, by a wire bond. The second semiconductor die may be disposed adjacent to a second surface of the first substrate portion and the fourth semiconductor die may be disposed adjacent to a second surface of the second substrate portion. The first semiconductor die may be electrically coupled to the second semiconductor die by a first wire bond, and the third semiconductor die may be electrically coupled to the fourth semiconductor die by a second wire bond. The second semiconductor die may be coupled to the first semiconductor die by a flip-chip assembly on the first substrate portion, and the fourth semiconductor die may be coupled to the third semiconductor die by a flip-chip assembly on the second substrate portion. An interposer circuit may be coupled to the second semiconductor die and the fourth semiconductor die. The first semiconductor die may be coupled to the second semiconductor die through the interposer circuit and the third semiconductor die may be coupled to the fourth semiconductor die through the interposer circuit. The first semiconductor die may be coupled to the first substrate portion through the interposer circuit and the second semiconductor die may be coupled to the second substrate portion through the interposer circuit. The second semiconductor die may comprise a first set of wire bond pads and a second set of wire bond pads and the fourth semiconductor die may comprise a third set of wire bond pads and a fourth set of wire bond pads. Each of the first set of wire bond pads may be electrically coupled to a respective one of the third set of wire bond pads. Each of the second set of wire bond pads may be electrically coupled to the first semiconductor die. Each of the fourth set of wire bond pads may be electrically coupled to the third semiconductor die. The first set of wire bond pads may be horizontally staggered from the second set of wire bond pads and the third set of wire bond pads may be horizontally staggered from the fourth set of wire bond pads.

According to one aspect, a method of fabricating an IC package may include providing a substrate defining a first substrate portion and a second substrate portion. Each of the first substrate portion and the second substrate portion may comprise a first surface and signal leads. A first semiconductor die may be electrically coupled to the substrate adjacent to the first surface of the first substrate portion. A second semiconductor die may be electrically coupled to the first semiconductor die vertically to the first semiconductor die. A third semiconductor die may be electrically coupled to the substrate adjacent to the first surface of the second substrate portion. A fourth semiconductor die may be electrically coupled to the third semiconductor die vertically of the third semiconductor die. The second semiconductor die may be electrically coupled to the fourth semiconductor die.

The method of fabricating the IC package may include one or more of the following features alone or in combination. The substrate may be a lead frame. The substrate may be a printed circuit board (PCB). The second and fourth semiconductor die may comprise isolation circuits and/or isolation capacitors. The first and third semiconductor die may be isolation circuits and/or capacitor. The first and second substrate portions may define an isolation gap therebetween. The first semiconductor die may be electrically coupled to the second semiconductor die by a first wire bond, and the third semiconductor die may be electrically coupled to the fourth semiconductor die by a second wire bond. The first semiconductor die may be electrically coupled to the second semiconductor die by a first silicon via, and the third semiconductor die may be electrically coupled to the fourth semiconductor die by a second silicon via. Each of the first and second semiconductor die may be coupled to the first and second substrate portions, respectively, by a wire bond. The second semiconductor die may be disposed adjacent to a second surface of the first substrate portion and the fourth semiconductor die may be disposed adjacent to a second surface of the second substrate portion. The first semiconductor die may be electrically coupled to the second semiconductor die by a first wire bond, and the third semiconductor die may be electrically coupled to the fourth semiconductor die by a second wire bond. The second semiconductor die may be coupled to the first semiconductor die by a flip-chip assembly on the first substrate portion, and the fourth semiconductor die may be coupled to the third semiconductor die by a flip-chip assembly on the second substrate portion. An interposer circuit may be coupled to the second semiconductor die and the fourth semiconductor die. The first semiconductor die may be coupled to the second semiconductor die through the interposer circuit and the third semiconductor die may be coupled to the fourth semiconductor die through the interposer circuit. The first semiconductor die may be coupled to the first substrate portion through the interposer circuit and the second semiconductor die may be coupled to the second substrate portion through the interposer circuit. The second semiconductor die may comprise a first set of wire bond pads and a second set of wire bond pads and the fourth semiconductor die may comprise a third set of wire bond pads and a fourth set of wire bond pads. Each of the first set of wire bond pads may be electrically coupled to a respective one of the third set of wire bond pads. Each of the second set of wire bond pads may be electrically coupled to the first semiconductor die. Each of the fourth set of wire bond pads may be electrically coupled to the third semiconductor die. The first set of wire bond pads may be horizontally staggered from the second set of wire bond pads and the third set of wire bond pads may be horizontally staggered from the fourth set of wire bond pads.

According to another aspect, an IC package may comprise a substrate defining a first substrate portion and a second substrate portion. Each of the first substrate portion and the second substrate portion may comprise a first surface and signal leads. A first semiconductor die may be electrically coupled to the substrate and disposed adjacent to the first surface of the first substrate portion. A first isolation circuit die may be electrically coupled to the first semiconductor die and disposed vertically to the first semiconductor die. A second semiconductor die may be electrically coupled to the substrate and disposed adjacent to the first surface of the second substrate portion. A second isolation circuit die may be electrically coupled to the second semiconductor die and disposed vertically of the second semiconductor die. The first isolation circuit die may be electrically coupled to the second isolation circuit die.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

The detailed description set forth below, in connection with the appended drawings, is intended as a description of various configurations and is not intended to represent the only configurations in which the concepts described herein may be practiced. The detailed description includes specific details for providing a thorough understanding of the various concepts. It will be apparent to those skilled in the art, however, that these concepts may be practiced without these specific details. In some instances, well-known structures and components are shown in block diagram form in order to avoid obscuring such concepts.

Figure 1:
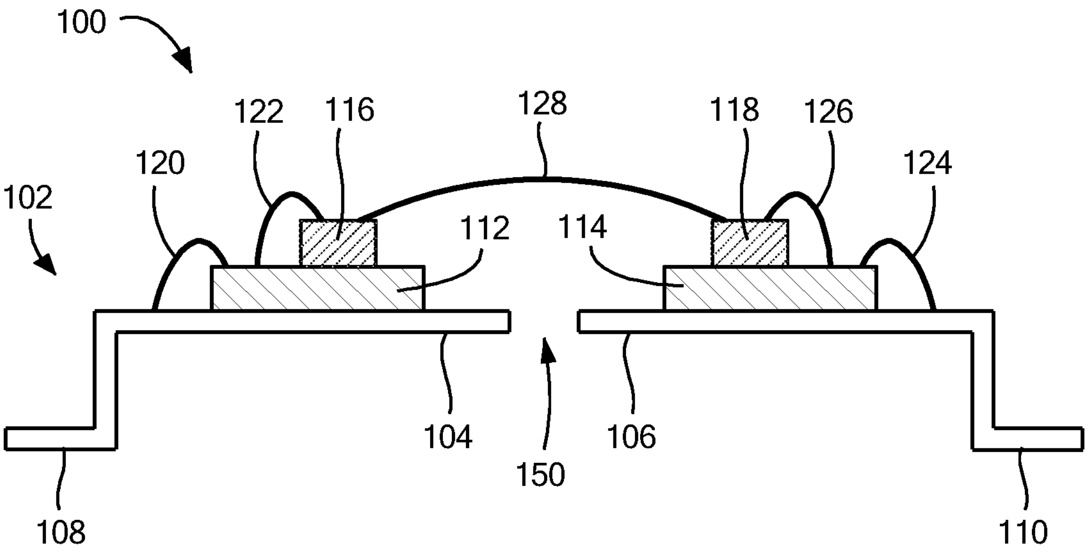
FIG. 1 is a partial side view of an integrated circuit (IC) package with stacked die according to aspects of the disclosure.

Referring now to FIG. 1, an integrated circuit (IC) package 100 may include a substrate, such as lead frame 102, having a first portion 104 and a second portion 106 separated by an isolation boundary 150. According to one aspect, the isolation boundary may be about 0.3 mm to 0.4 mm wide, for example. The IC package 100 may include, as described below, one or more semiconductor die, referred to herein as die or semiconductor die. The first portion 104 of the lead frame 102 may include signal leads 108 configured to be coupled to an external system or printed circuit board (PCB) which may carry an input or output signal to or from the IC package 100.

Similarly, the second portion 106 of the lead frame 102 may include signal leads 110 to couple the IC package 100 to an external system or PCB. The IC package 100 may include a molding material (not shown), made of a non-conductive material, such as plastic, encapsulating the lead frame 102 and other circuitry described below. The IC package 100 may be considered a small-outline integrated circuit (SOIC), however other package types, such as QFN (Quad-Flat No-Leads), or DFN (Dual-Flat No-Leads) IC packages are possible. Further, while the substrate may be considered a lead frame 102, other substrates, such as a PCB, are possible.

According to one aspect, a first die 112 may be disposed adjacent to a first surface, such as a top surface, of the first portion 104 of the lead frame 102. The first die 112 may include one or more active ICs and be electrically coupled to the lead frame 102 by, for example, a wire bond 120. A second die 116 may be disposed adjacent and vertically (i.e. stacked) to the first die 112. The second die 116 may be electrically coupled to the first die 112 by, for example a wire bond 122.

According to one aspect, a third die 114 may be disposed adjacent to a first surface, such as a top surface, of the second portion 106 of the lead frame 102. The third die 114 may include one or more active ICs and be electrically coupled to the lead frame 102 by, for example, a wire bond 124. A fourth die 118 may be disposed adjacent and vertically (i.e. stacked) to the third die 114. The fourth die 118 may be electrically coupled to the third die 114 by, for example, one or more wire bonds 126. The second die 116 and the fourth die 118 may be electrically coupled to each other, for example by a wire bond 128.

According to one aspect, the IC package 100 may be used, for example, in a traction inverter, on-board charger (OBC) or other automobile system in which high voltage inputs and outputs may need to be electrically isolated from low-voltage electronics or human-accessible terminals. Accordingly, as shown in FIG. 1, the first die 112 and the third die 114 may be or include circuits in a low-voltage domain and a high-voltage domain, respectively. According to one aspect, one function of the die 112, 114 may be galvanically isolated gate drivers and auxiliary functions associated with this type of circuit. These auxiliary functions may include signal modulation and demodulation, active miller-clamp, over-current protection, desaturation protection, or the like. Additionally, isolated power generation may be managed by the die 112, 114 in the form of an LLC converter. The die 112, 114 may provide the power control loop and the power switches to manage the power transfer across a galvanically isolated transformer.

The second die 116 and the fourth die 118 may be or include high-voltage (HV) isolation capacitors adapted to eliminate direct current (DC) and unwanted alternating current (AC) from passing between the first die 112 and the third die 114.

According to one aspect, stacking the isolation capacitors, such as the second die 116 and the fourth die 118, vertically to the active IC die, such as the first die 112 and the third die 114, respectively, reduces the width of substrate surface needed to place the four die, leveraging the ability to use a standard package width, for example 7.5 mm (300 μm), while increasing the package functionality. The vertical stacking and wire bonding configurations provide for a substantially similar electrical connection layout as conventional isolation IC packages, but with a reduced or standard lead frame/substrate width, providing a more flexible and compact package for inclusion on a PCB.

While the die shown in FIG. 1 may be electrically coupled to each other and the lead frame 102 by one or more wire bonds, other interconnections are possible, including, without limitation, through-silicon vias, flip-chip attachment, solder bumps, and the like.

According to one aspect, die may be interconnected with through-silicon vias (TSV) formed in the one or more die.

Figure 2:
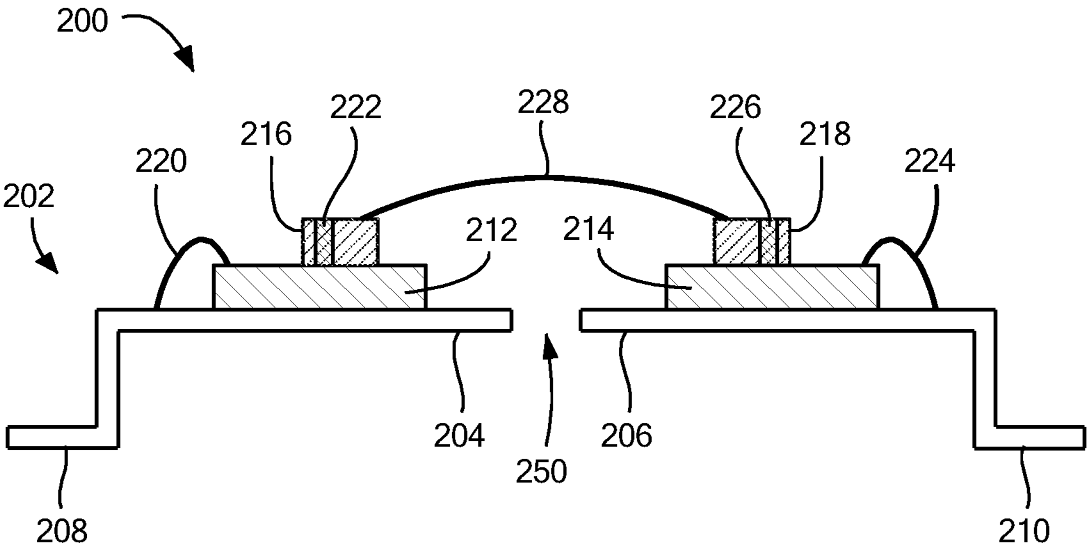
FIG. 2 is a partial side view of an IC package with stacked die and silicon vias according to aspects of the disclosure.

FIG. 2 shows an IC package 200 substantially similar to the IC package 100 of FIG. 1, including a substrate, such as lead frame 202, having a first portion 204 and a second portion 206 separated by an isolation boundary 250. The IC package 200 may include, as described below, one or more semiconductor die. The first portion 204 of the lead frame may include signal leads 208 configured to be coupled to an external system or PCB which may carry an input or output signal to or from the IC package 200.

Similarly, the second portion 206 of the lead frame 202 may include signal leads 210 to couple the IC package 200 to an external system or PCB. The IC package 200 may include a molding material (not shown), made of a non-conductive material, such as plastic, encapsulating the lead frame 202 and other circuitry described below. The IC package 200 may be considered a SOIC, however other package types, such as QFN or DEN IC packages, are possible. Further, while the substrate may be considered a lead frame 202, other substrates, such as a PCB, are possible.

According to one aspect, a first die 212 may be disposed adjacent to a first surface, such as a top surface, of the first portion 204 of the lead frame 202. The first die 212 may include one or more active ICs and be electrically coupled to the lead frame 202 by, for example, one or more wire bonds 220. A second die 216 may be disposed adjacent and vertically (i.e. stacked) to the first die 212.

According to one aspect, a third die 214 may be disposed adjacent to a first surface, such as a top surface, of the second portion 206 of the lead frame 202. The third die 214 may include one or more active ICs and be electrically coupled to the lead frame 202 by, for example, one or more wire bonds 224. A fourth die 218 may be disposed adjacent and vertically (i.e. stacked) to the third die 214. The second die 216 and the fourth die 218 may be electrically coupled to each other, for example by a wire bond 228.

Rather than wire bonding the second die 216 to the first die 212 and the third die 214 to the fourth die 218, according to one aspect, TSVs 222, 226 may be used to electrically couple the respective die. Accordingly, the second die 216 may be electrically coupled to the first die 212 by the TSV 222. The fourth die 218 may be electrically coupled to the third die 214 by the TSV 226.

Figure 3:
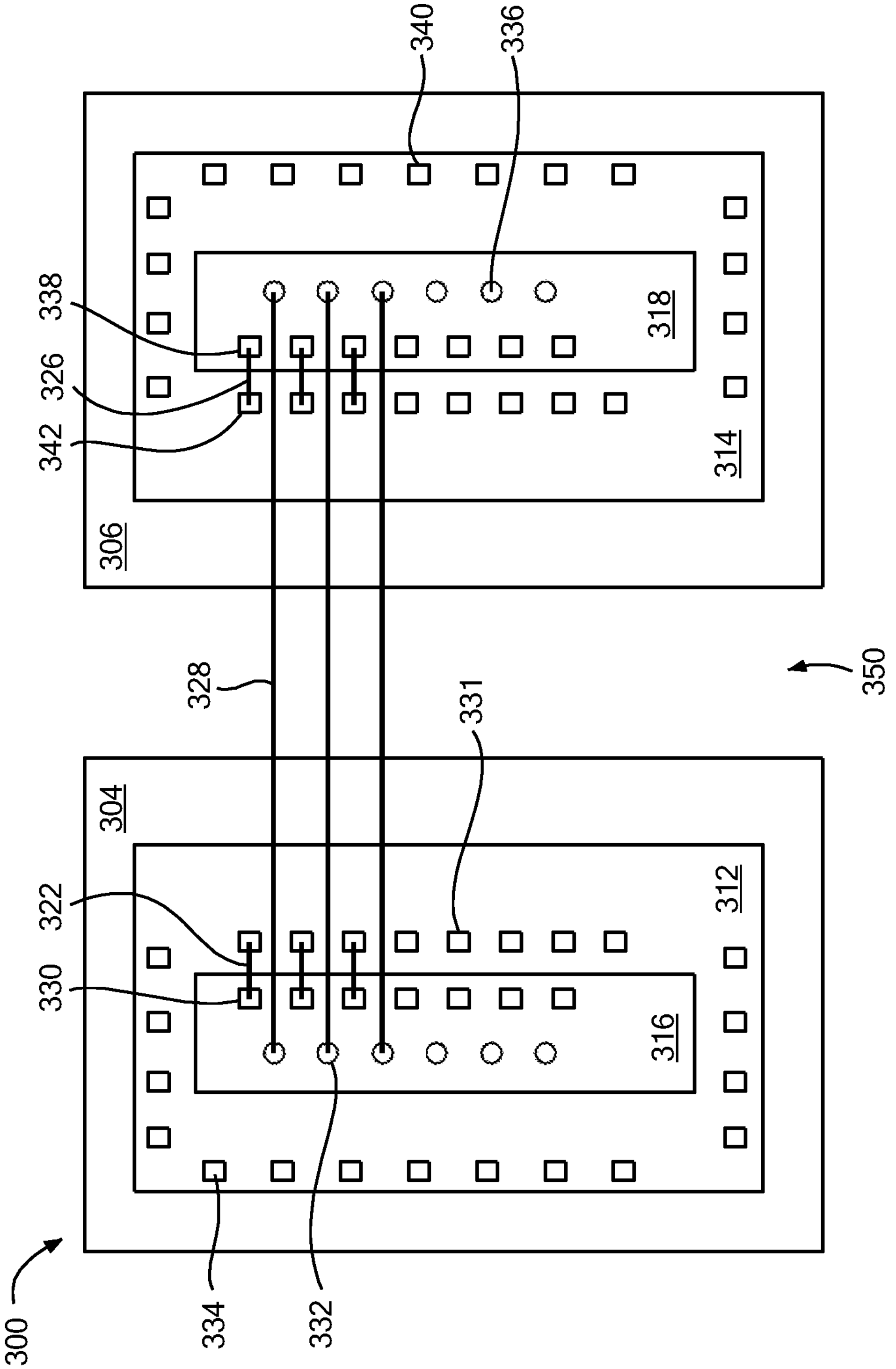
FIG. 3 is a partial top plan view of an IC package with stacked die and according to aspects of the disclosure.

FIG. 3 is a partial top plan view of an IC package 300 including a staggered wire bonding configuration between an isolation capacitor and an active IC die. Like the IC package 100 of FIG. 1, the IC package 300 shown in FIG. 3 may include a first die 312 disposed adjacent to a first substrate portion 304 and a second die 316 disposed vertically to the first die 312. A third die 314 may be disposed adjacent to a second lead frame portion 306 and a fourth die 318 may be disposed vertically to the third die 314. The first lead frame portion 304 and the second lead frame portion may be separated by an isolation gap 350.

According to one aspect, the first die 312 may include a plurality of first bond pads, collectively labeled 334, disposed about or near a portion of the perimeter of the first die 312. The first bond pads 334 may serve as connection points for the wire bonds (not shown) between the first die 312 and the first lead frame portion 304. According to one aspect, the first bond pads 334 of the first die 312 may be disposed about or near a portion of the perimeter of the first die 312 away from the second lead frame portion 306. Such a configuration may avoid or reduce any interference, electrical, magnetic or otherwise, with the interconnections to the second die 316, described below.

The first die 312 may further include a plurality of second bond pads, collectively labeled 331 disposed between the second die 316 and the isolation gap 350. The second bond pads 331 may be connection points between first die 312 and the second die 316 through one or more wire bonds 322.

The second die 316 may include a plurality of first bond pads, collectively labeled 330 as connection points to the first die 312 through the wire bonds 322. The second die 316 may further include second bond pads, collectively labeled 332, as connection points between the second die 316 and the fourth die 318.

According to one aspect, the third die 314 may include a plurality of first bond pads, collectively labeled 340, disposed about or near a portion of the perimeter of the third die 314. The first bond pads 340 may serve as connection points for the wire bonds (not shown) between the third die 314 and the second lead frame portion 306. According to one aspect, the first bond pads 340 of the third die 314 may be disposed about or near a portion of the perimeter of the third die 314 away from the first lead frame portion 304 and the isolation gap 350. Such a configuration may avoid or reduce any interference, electrical, magnetic or otherwise, with the interconnections to the fourth die 318, described below.

The third die 314 may further include a plurality of second bond pads, collectively labeled 342, disposed between the fourth die 318 and the isolation gap 350. The second bond pads 342 may be connection points between third die 314 and the fourth die 318 through one or more wire bonds 326.

The fourth die 318 may include a plurality of first bond pads, collectively labeled 338, as connection points to the third die 314 through the wire bonds 326. The fourth die 318 may further include second bond pads, collectively labeled 336, as connection points between the fourth die 318 and the second die 318.

According to aspects in which the second die 316 and the fourth die 318 are isolation capacitors, the wire bonds 322, 326 may be low voltage bonds between the isolation capacitors and the active ICs on the first die 312 and the second die 314, respectively. The wire bonds 328 between the second die 316 and the fourth die 318 may be high voltage bonds between the two isolation capacitors.

As shown in FIG. 3, the first bond pads 330 on the second die 316 may be disposed in a staggered arrangement with respect to the second bond pads 332. Similarly, on the fourth die 318, the first bond pads 338 may be staggered with respect to the second bond pads 336. The staggered arrangement of the bond pads on the second die 316 and the fourth die 318 may allow for wire bonding at high voltage and leverage the ability to use a first die 312 and a third die 314 with conventional bonding pad layouts, like first bond pads 334, 340 and second bond pads 331, 342, disposed about or near the perimeter of the respective die. In such a configuration, however, consideration may be given to the staggered spacing to ensure the distance between first bonding pads 330, 338 and the second bonding pads 332, 336 is sufficient to avoid high voltage breakdown in the molding material between the low voltage wire bonds, such as bonds 322, 326, and high voltage wire bonds, such as bonds 328.

Figure 4:
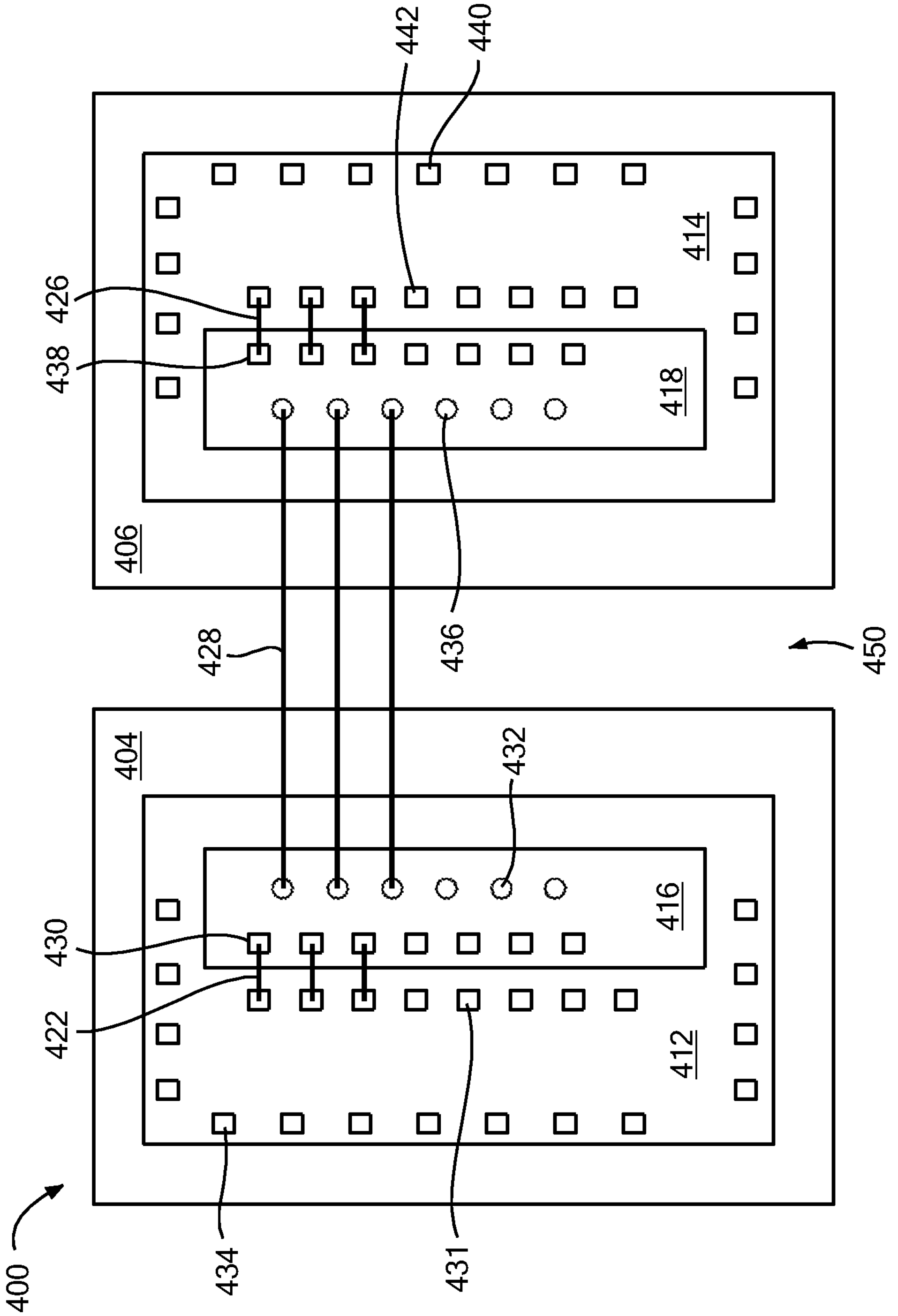
FIG. 4 is a partial top plan view of an IC package with an alternative bond pad arrangement according to aspects of the disclosure.

FIG. 4 depicts an alternative bonding configuration of an IC package 400, similar to the IC package 300 of FIG. 3. The IC package 400 may include a first die 412 disposed adjacent to a first substrate portion 404 and a second die 416 disposed vertically to the first die 412. A third die 414 may be disposed adjacent to a second lead frame portion 406 and a fourth die 418 may be disposed vertically to the third die 414. The first lead frame portion 404 and the second lead frame portion 406 may be separated by an isolation gap 450.

According to one aspect, the first die 412 may include a plurality of first bond pads, collectively labeled 434, disposed about or near a portion of the perimeter of the first die 412. The first bond pads 434 may serve as connection points for the wire bonds (not shown) between the first die 412 and the first lead frame portion 404. According to one aspect, the first bond pads 434 of the first die 412 may be disposed about or near a portion of the perimeter of the first die 412 away from the second lead frame portion 406. Such a configuration may avoid or reduce any interference, electrical, magnetic or otherwise, with the interconnections to the second die 416, described below.

The first die 412 may further include a plurality of second bond pads, collectively labeled 431, disposed between the second die 316 and the first bond pads 434. The second bond pads 431 may be connection points between first die 412 and the second die 416 through one or more wire bonds 422.

The second die 416 may include a plurality of first bond pads, collectively labeled 430, as connection points to the first die 412 through the wire bonds 422. The second die 416 may further include second bond pads, collectively labeled 432, as connection points between the second die 416 and the fourth die 418.

According to one aspect, the third die 414 may include a plurality of first bond pads, collectively labeled 440, disposed about or near a portion of the perimeter of the third die 414. The first bond pads 440 may serve as connection points for the wire bonds (not shown) between the third die 414 and the second lead frame portion 406. According to one aspect, the first bond pads 440 of the third die 414 may be disposed about or near a portion of the perimeter of the third die 414 away from the first lead frame portion 404 and the isolation gap 450. Such a configuration may avoid or reduce any interference, electrical, magnetic or otherwise, with the interconnections to the fourth die 418, described below.

The third die 414 may further include a plurality of second bond pads, collectively labeled 442, disposed between the fourth die 418 and the first bond pads 440. The second bond pads 442 may be connection points between third die 414 and the fourth die 418 through one or more wire bonds 426.

The fourth die 418 may include a plurality of first bond pads, collectively labeled 438, as connection points to the third die 414 through the wire bonds 426. The fourth die 418 may further include second bond pads, collectively labeled 436, as connection points between the fourth die 418 and the second die 418.

According to aspects in which the second die 416 and the fourth die 418 are isolation capacitors, the wire bonds 422, 426 may be low voltage bonds between the isolation capacitors and the active ICs on the first die 412 and the second die 414, respectively. The wire bonds 428 between the second die 416 and the fourth die 418 may be high voltage bonds between the two isolation capacitors.

As shown in FIG. 4, the first bond pads 430 and the second bond pads 432 of the second die 416 may be substantially aligned to allow for a standard capacitor bond pad configuration. Similarly, the first bond pads 438 and the second bond pads 436 of the fourth die 418 may be substantially aligned to allow for a standard capacitor bond pad configuration. This configuration may also reduce or avoid high voltage breakdown between adjacent wire bonds since the wire bonds 422, 426 connecting the second die 416 to the first die 412 and the fourth die 418 to the third die 414 are disposed on the sides of the die opposite to the isolation gap 450.

Figure 5:
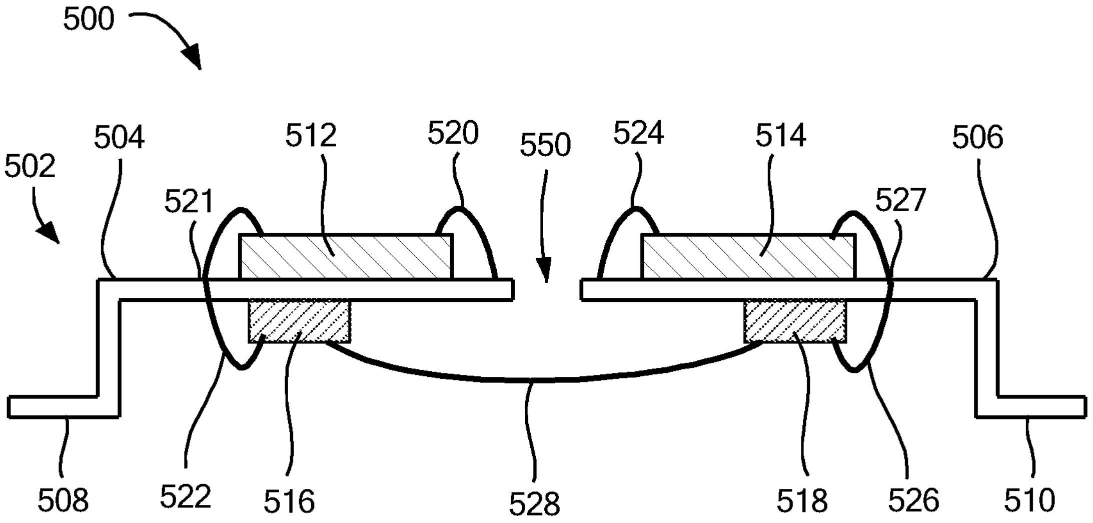
FIG. 5 is a partial side view of an IC package with a dual-sided lead frame assembly according to aspects of the disclosure.

Referring now to FIG. 5, an alternative four-die IC package 500 may include a substrate, such as lead frame 502, having a first portion 504 and a second portion 506 separated by an isolation boundary 550. The IC package 500 may include, as described below, one or more semiconductor die. The first portion 504 of the lead frame may include signal leads 508 configured to be coupled to an external system or PCB which may carry an input or output signal to or from the IC package 500.

Similarly, the second portion 506 of the lead frame 502 may include signal leads 510 to couple the IC package 500 to an external system or PCB. The IC package 500 may include a molding material (not shown), made of a non-conductive material, such as plastic, encapsulating the lead frame 502 and other circuitry described below. The IC package 500 may be considered an SOIC, however other package types, such as QFN or DEN IC packages are possible. Further, while the substrate may be considered a lead frame 502, other substrates, such as a PCB, are possible.

According to one aspect, a first die 512 may be disposed adjacent to a first surface, such as a top surface, of the first portion 504 of the lead frame 502. The first die 512 may include one or more active ICs and be electrically coupled to the lead frame 502 by, for example, one or more wire bonds 520. A second die 516 may be disposed vertically to the first die 512 on a second surface, such as a bottom surface, of the first portion 504 of the lead frame 502. The second die 516 may be electrically coupled to the first die 512 by, for example one or more wire bonds 522 having a common junction 521 on the lead frame 502.

According to one aspect, a third die 514 may be disposed adjacent to a first surface, such as a top surface, of the second portion 506 of the lead frame 502. The third die 514 may include one or more active ICs and be electrically coupled to the lead frame 502 by, for example, one or more wire bonds 524. A fourth die 518 may be disposed vertically to the third die 514 on a second surface, such as a bottom surface, of the second portion 506 of the lead frame 502. The fourth die 518 may be electrically coupled to the third die 514 by, for example one or more wire bonds 526 having a common junction 527 on the lead frame 502. The second die 516 and the fourth die 518 may be connected across the boundary gap 550 by one or more wire bonds 528.

Special consideration may be given to the wire bonds 522, 526 that wrap around the lead frame 502 as such connections may present die clamping challenges during manufacture and processing operations. According to one aspect, the lead frame 502 may include a specialized design to accommodate the interconnects or backside connections to the opposite die on the same track of the lead frame 502.

Figure 6:
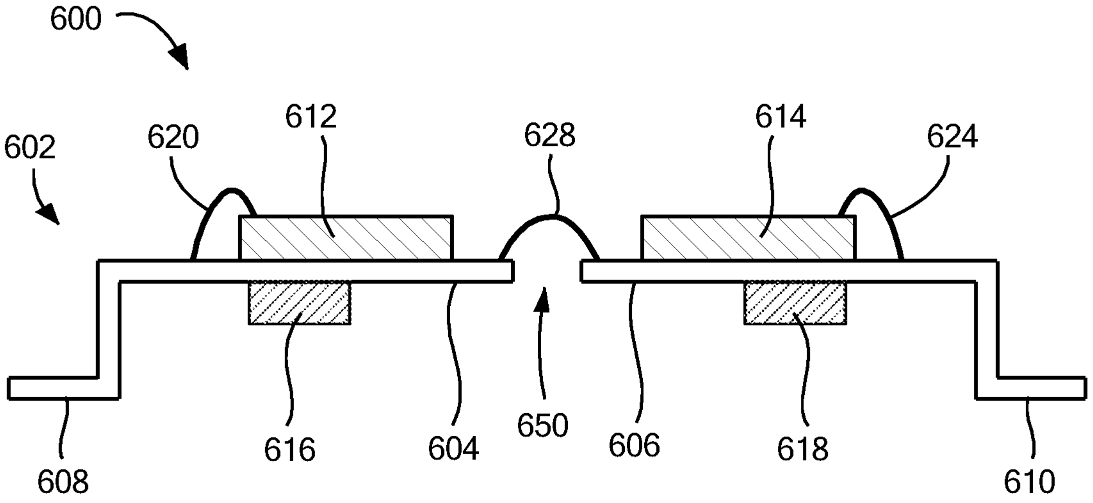
FIG. 6 is a partial side view of an IC package with flip-chip and dual-sided lead frame assembly according to aspects of the disclosure.

Referring now to FIG. 6, an alternative four-die, flip-chip IC package 600 may include a substrate, such as lead frame 602, having a first portion 604 and a second portion 606 separated by an isolation boundary 650. The IC package 600 may include, as described below, one or more semiconductor die. The first portion 604 of the lead frame may include signal leads 608 configured to be coupled to an external system or PCB which may carry an input or output signal to or from the IC package 600.

Similarly, the second portion 606 of the lead frame 602 may include signal leads 610 to couple the IC package 600 to an external system or PCB. The IC package 600 may include a molding material (not shown), made of a non-conductive material, such as plastic, encapsulating the lead frame 602 and other circuitry described below. The IC package 600 may be considered an SOIC, however other package types, such as QFN or DEN IC packages are possible. Further, while the substrate may be considered a lead frame 602, other substrates, such as a PCB, are possible.

According to one aspect, a first die 612 may be disposed adjacent to a first surface, such as a top surface, of the first portion 604 of the lead frame 602. The first die 612 may include one or more active ICs and be electrically coupled to the lead frame 602 by, for example, one or more wire bonds 620. A second die 616 may be disposed vertically to the first die 612 on a second surface, such as a bottom surface, of the first portion 604 of the lead frame 602. The second die 616 may be a flip-chip configuration electrically coupled to the first die 612 through the lead frame 602.

According to one aspect, a third die 614 may be disposed adjacent to a first surface, such as a top surface, of the second portion 606 of the lead frame 602. The third die 614 may include one or more active ICs and be electrically coupled to the lead frame 602 by, for example, one or more wire bonds 624. A fourth die 618 may be disposed vertically to the third die 614 on a second surface, such as a bottom surface, of the second portion 606 of the lead frame 602. The fourth die 618 may be a flip-chip configuration electrically coupled to the third die 614 through the lead frame 602. The second die 616 and the fourth die 618 may be connected across the boundary gap 650 by one or more wire bonds 628 and circuitry coupling the first portion 604 and the second portion 606 of the lead frame 602.

Figure 7:
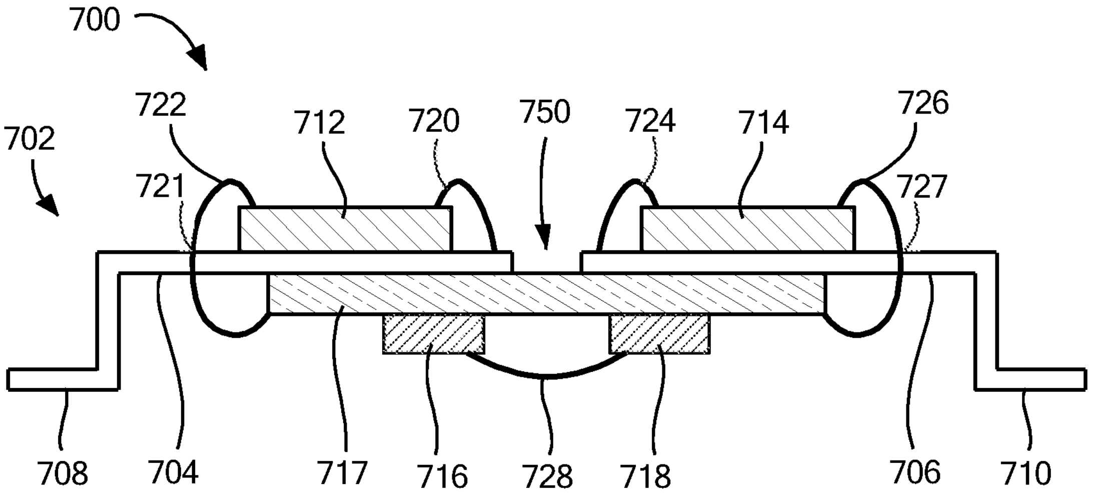
FIG. 7 is a partial side view of an IC package with a dual-sided lead frame and interposer assembly according to aspects of the disclosure.

Referring now to FIG. 7 a multi-die IC package 700 with an interposer 717 is shown. The IC package 700 may include a substrate, such as lead frame 702, having a first portion 704 and a second portion 706 separated by an isolation boundary 750. The IC package 700 may include, as described below, one or more semiconductor die. The first portion 704 of the lead frame may include signal leads 708 configured to be coupled to an external system or PCB which may carry an input or output signal to or from the IC package 700.

Similarly, the second portion 706 of the lead frame 702 may include signal leads 710 to couple the IC package 700 to an external system or PCB. The IC package 700 may include a molding material (not shown), made of a non-conductive material, such as plastic, encapsulating the lead frame 702 and other circuitry described below. The IC package 700 may be considered an SOIC, however other package types, such as QFN or DEN IC packages are possible. Further, while the substrate may be considered a lead frame 702, other substrates, such as a PCB, are possible.

According to one aspect, a first die 712 may be disposed adjacent to a first surface, such as a top surface, of the first portion 704 of the lead frame 702. The first die 712 may include one or more active ICs and be electrically coupled to the lead frame 702 by, for example, one or more wire bonds 720. A second die 716 may be disposed vertically to the first die 712 on an interposer 717. The interposer 717 may be disposed on a second surface, such as a bottom surface, of the first portion 704 and the second portion 706 of the lead frame 702 spanning the boundary gap 750. The second die 716 may be electrically coupled to the interposer 717 by a flip-chip configuration. The interposer 717 may be coupled to the first die 712 by, for example one or more wire bonds 722 having a common junction 721 one the lead frame 702.

According to one aspect, a third die 714 may be disposed adjacent to a first surface, such as a top surface, of the second portion 706 of the lead frame 702. The third die 714 may include one or more active ICs and be electrically coupled to the lead frame 702 by, for example, one or more wire bonds 724. A fourth die 718 may be disposed vertically to the third die 714 on the interposer 717. The fourth die 718 may be electrically coupled to the interposer by a flip-chip configuration. The interposer 717 may be coupled to the third die 714 by, for example one or more wire bonds 726 having a common junction 726 on the lead frame 702. The second die 716 and the fourth die 718 may be connected across the boundary gap 750 by one or more wire bonds 728.

According to one aspect the interposer 717 may be used to create a separate component including the second die 716 and the fourth die 718. The use of the interposer 717 may facilitate and simplify assembly and interconnection of the die in the IC package 700. Placing the second die 716 and the fourth die 718 on the interposer 717 may also facilitate testing of the die.

Figure 8:
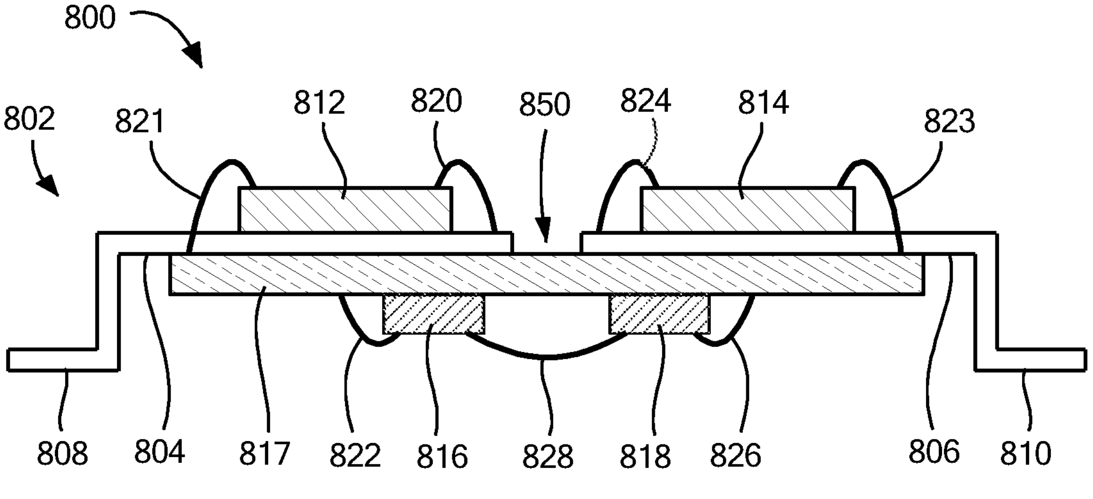
FIG. 8 is a partial side view of an IC package with an alternative dual-sided lead frame and interposer assembly according to aspects of the disclosure.

FIG. 8 depicts an alternative configuration of an IC package 800 with an interposer 817. The IC package 800 may include a substrate, such as lead frame 802, having a first portion 804 and a second portion 806 separated by an isolation boundary 850. The IC package 800 may include, as described below, one or more semiconductor die. The first portion 804 of the lead frame may include signal leads 808 configured to be coupled to an external system or PCB which may carry an input or output signal to or from the IC package 800.

Similarly, the second portion 806 of the lead frame 802 may include signal leads 810 to couple the IC package 800 to an external system or PCB. The IC package 800 may include a molding material (not shown), made of a non-conductive material, such as plastic, encapsulating the lead frame 802 and other circuitry described below. The IC package 800 may be considered an SOIC, however other package types, such as QFN or DFN IC packages are possible. Further, while the substrate may be considered a lead frame 802, other substrates, such as a PCB, are possible.

According to one aspect, a first die 812 may be disposed adjacent to a first surface, such as a top surface, of the first portion 804 of the lead frame 802. The first die 812 may include one or more active ICs and be electrically coupled to the lead frame 802 by, for example, one or more wire bonds 820. A second die 816 may be disposed vertically to the first die 812 on an interposer 817. The interposer 817 may be disposed to a second surface, such as a bottom surface, of the first portion 804 and the second portion 806 of the lead frame 802 spanning the boundary gap 850. The second die 816 may be electrically coupled to the interposer 817 by one or more wire bonds 822. The interposer 817 may be directly coupled to the first die 812 by one or more wraparound connectors, for example wire bonds 821, one or more vias or similar connections.

According to one aspect, a third die 814 may be disposed adjacent to a first surface, such as a top surface, of the second portion 806 of the lead frame 802. The third die 814 may include one or more active ICs and be electrically coupled to the lead frame 802 by, for example, one or more wire bonds 824. A fourth die 818 may be disposed vertically to the third die 814 on the interposer 817. The fourth die 818 may be electrically coupled to the interposer by one or more wire bonds 826. The interposer 817 may be directly coupled to the third die 814 by one or more wraparound connectors, for example wire bonds 823, one or more vias or similar connections. The second die 816 and the fourth die 818 may be connected across the boundary gap 850 by one or more wire bonds 828.

While the aspects of the various IC packages described herein may include a number of active IC die coupled to respective isolation capacitors, one skilled in the art will recognize that the multi-chip configurations are not limited to those specific die. Aspects of the present disclosure may also include any multi-chip IC package with compact and vertically arranged die adapted to provide additional functionality while leveraging the width and overall size of a standard IC package.

Based on the teachings, one skilled in the art should appreciate that the scope of the present disclosure is intended to cover any aspect of the present disclosure, whether implemented independently of or combined with any other aspect of the present disclosure. For example, an apparatus may be implemented or a method may be practiced using any number of the aspects set forth. In addition, the scope of the present disclosure is intended to cover such an apparatus or method practiced using other structure, functionality, or structure and functionality in addition to, or other than the various aspects of the present disclosure set forth. It should be understood that any aspect of the present disclosure may be embodied by one or more elements of a claim.

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

As used herein, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An integrated circuit (IC) package comprising:

a substrate defining a first substrate portion and a second substrate portion; each of the first substrate portion and the second substrate portion comprising a first surface and signal leads;

a first semiconductor die electrically coupled to the substrate and disposed adjacent to the first surface of the first substrate portion, a second semiconductor die electrically coupled to the first semiconductor die and disposed vertically to the first semiconductor die;

a third semiconductor die electrically coupled to the substrate and disposed adjacent to the first surface of the second substrate portion; and a fourth semiconductor die electrically coupled to the third semiconductor die and disposed vertically of the third semiconductor die, the second semiconductor die electrically coupled to the fourth semiconductor die.

2. The IC package of claim 1 wherein the substrate is a lead frame.

3. The IC package of claim 1 wherein the substrate is a printed circuit board (PCB).

4. The IC package of claim 1 wherein the second and fourth semiconductor die comprise isolation circuits.

5. The IC package of claim 4 wherein the isolation circuits comprise capacitors.

6. The IC package of claim 1 wherein the first and third semiconductor die are isolation circuits.

7. The IC package of claim 6 wherein the isolation circuits comprise a capacitor.

8. The IC package of claim 1 wherein the first and second substrate portions define an isolation gap therebetween.

9. The IC package of claim 1 wherein the first semiconductor die is electrically coupled to the second semiconductor die by a first wire bond, and the third semiconductor die is electrically coupled to the fourth semiconductor die by a second wire bond.

10. The IC package of claim 1 wherein the first semiconductor die is electrically coupled to the second semiconductor die by a first silicon via, and the third semiconductor die is electrically coupled to the fourth semiconductor die by a second silicon via.

11. The IC package of claim 1 wherein each of the first and third semiconductor die are coupled to the first and second substrate portions, respectively, by a wire bond.

12. The IC package of claim 1 wherein the second semiconductor die is disposed adjacent to a second surface of the first substrate portion and the fourth semiconductor die is disposed adjacent to a second surface of the second substrate portion.

13. The IC package of claim 12 wherein the first semiconductor die is electrically coupled to the second semiconductor die by a first wire bond, and the third semiconductor die is electrically coupled to the fourth semiconductor die by a second wire bond.

14. The IC package of claim 12 wherein the second semiconductor die is coupled to the first semiconductor die by a flip-chip assembly on the first substrate portion, and the fourth semiconductor die is coupled to the third semiconductor die by a flip-chip assembly on the second substrate portion.

15. The IC package of claim 12 further comprising an interposer circuit coupled to the second semiconductor die and the fourth semiconductor die, the first semiconductor die coupled to the second semiconductor die through the interposer circuit and the third semiconductor die coupled to the fourth semiconductor die through the interposer circuit.

16. The IC package of claim 15 wherein the first semiconductor die is coupled to the first substrate portion through the interposer circuit and the second semiconductor die is coupled to the second substrate portion through the interposer circuit.

17. The IC package of claim 1 wherein:

the second semiconductor die comprises a first set of wire bond pads and a second set of wire bond pads and the fourth semiconductor die comprises a third set of wire bond pads and a fourth set of wire bond pads, and further wherein each of the first set of wire bond pads are electrically coupled to a respective one of the third set of wire bond pads, each of the second set of wire bond pads are electrically coupled to the first semiconductor die, and each of the fourth set of wire bond pads are electrically coupled to the third semiconductor die.

18. The IC package of claim 17 wherein the first set of wire bond pads are horizontally staggered from the second set or wire bond pads and the third set of wire bond pads are horizontally staggered from the fourth set of wire bond pads.

19. A method of fabricating an integrated circuit (IC) package, the method comprising:

providing a substrate defining a first substrate portion and a second substrate portion; each of the first substrate portion and the second substrate portion comprising a first surface and signal leads;

electrically coupling a first semiconductor die to the substrate adjacent to the first surface of the first substrate portion, electrically coupling a second semiconductor die to the first semiconductor die vertically to the first semiconductor die;

electrically coupling a third semiconductor die to the substrate adjacent to the first surface of the second substrate portion;

electrically coupling a fourth semiconductor die to the third semiconductor die vertically of the third semiconductor die; and electrically coupling the second semiconductor die to the fourth semiconductor die.

20. The method of claim 19 wherein the substrate is a lead frame.

21. The method of claim 19 wherein the substrate is a printed circuit board (PCB).

22. The method of claim 19 wherein the second and fourth semiconductor die comprise isolation circuits.

23. The method of claim 22 wherein the isolation circuits comprise capacitors.

24. The method of claim 19 wherein the first and third semiconductor die are isolation circuits.

25. The method of claim 24 wherein the isolation circuits comprise a capacitor.

26. The method of claim 19 further comprising defining an isolation gap between the first and second substrate portions.

27. The method of claim 19 wherein the first semiconductor die is electrically coupled to the second semiconductor die by a first wire bond, and the third semiconductor die is electrically coupled to the fourth semiconductor die by a second wire bond.

28. The method of claim 19 wherein the first semiconductor die is electrically coupled to the second semiconductor die by a first silicon via, and the third semiconductor die is electrically coupled to the fourth semiconductor die by a second silicon via.

29. The method of claim 19 wherein the second semiconductor die is disposed adjacent to a second surface of the first substrate portion and the fourth semiconductor die is disposed adjacent to a second surface of the second substrate portion.

30. The method of claim 29 further comprising an interposer circuit coupled to the second semiconductor die and the fourth semiconductor die, the first semiconductor die coupled to the second semiconductor die through the interposer circuit and the third semiconductor die coupled to the fourth semiconductor die through the interposer circuit.

31. An integrated circuit (IC) package comprising:

a substrate defining a first substrate portion and a second substrate portion; each of the first substrate portion and the second substrate portion comprising a first surface and signal leads;

a first semiconductor die electrically coupled to the substrate and disposed adjacent to the first surface of the first substrate portion, a first isolation circuit die electrically coupled to the first semiconductor die and disposed vertically to the first semiconductor die;

a second semiconductor die electrically coupled to the substrate and disposed adjacent to the first surface of the second substrate portion; and a second isolation circuit die electrically coupled to the second semiconductor die and disposed vertically of the second semiconductor die, the first isolation circuit die electrically coupled to the second isolation circuit die.

* * * * *